United States Patent
Miyazaki

(10) Patent No.: US 8,119,451 B2
(45) Date of Patent: Feb. 21, 2012

(54) METHOD OF MANUFACTURING SEMICONDUCTOR PACKAGE AND METHOD OF MANUFACTURING SUBSTRATE FOR THE SEMICONDUCTOR PACKAGE

(75) Inventor: Masashi Miyazaki, Oita (JP)

(73) Assignee: Sony Corporation, Tokyo (JP)

(*) Notice: Subject to any disclaimer, the term of this patent is extended or adjusted under 35 U.S.C. 154(b) by 90 days.

(21) Appl. No.: 12/794,293

(22) Filed: Jun. 4, 2010

(65) Prior Publication Data

US 2010/0323474 A1    Dec. 23, 2010

(30) Foreign Application Priority Data

Jun. 18, 2009   (JP) ................................ 2009-145229

(51) Int. Cl.
*H01L 21/00* (2006.01)
(52) U.S. Cl. .......................... 438/108; 438/612; 438/616
(58) Field of Classification Search .................. 438/108, 438/612, 616
See application file for complete search history.

(56) References Cited

U.S. PATENT DOCUMENTS

| 7,411,304 | B2 * | 8/2008 | Kirby et al. ................. 257/773 |
| 2004/0046244 | A1 * | 3/2004 | Nakamura et al. ............ 257/700 |
| 2006/0022591 | A1 | 2/2006 | Wie meier et al. |
| 2009/0134530 | A1 * | 5/2009 | Kurihara et al. .............. 257/784 |

FOREIGN PATENT DOCUMENTS

JP    2006-295114    10/2006

* cited by examiner

*Primary Examiner* — Richard A. Booth
(74) *Attorney, Agent, or Firm* — SNR Denton US LLP

(57) ABSTRACT

A method of manufacturing a semiconductor package, includes the steps of: forming a substrate on which a semiconductor chip is to be mounted; and mounting the semiconductor chip on the substrate through connection bumps, the substrate forming step including a first step of forming a plurality of electrode pads to be bonded to the connection bumps on a part of a support plate, a second step of forming one or more wiring layers on the support plate including the electrode pads with an insulation layer interposed between them, thereby forming a substrate having the electrode pads formed thereon on one side thereof, and a third step of removing the substrate from the support plate, wherein a plurality of first convex portions are formed on the support plate prior to the first step, and the electrode pads are formed on the first convex portions at the first step.

8 Claims, 11 Drawing Sheets

METHOD OF MANUFACTURING SEMICONDUCTOR PACKAGE AND METHOD OF MANUFACTURING SUBSTRATE FOR THE SEMICONDUCTOR PACKAGE

BACKGROUND OF THE INVENTION

1. Field of the Invention

The present invention relates to a method of manufacturing a semiconductor package and a method of manufacturing a substrate for the semiconductor package. More particularly, the invention relates to a method of manufacturing a semiconductor package having a semiconductor chip mounted on a substrate and a method of manufacturing the substrate.

2. Description of the Related Art

Recently, there is a trend toward semiconductor packages having smaller thicknesses, and the trend is accompanied by similar requirements on semiconductor chips to be contained in such semiconductor packages, the requirements obviously including reductions in the thickness of such chips and improvements in the fineness of wirings and also including reductions in the thickness of substrates on which such semiconductors are to be mounted.

Proposed methods for providing a substrate having a small thickness include the use of a coreless substrate having no core layer as shown in FIG. 13. Electrode pads on a coreless substrate are formed to be coplanar with an insulation layer on a surface of the substrate, which results in various problems when flip-chip connections are made on the substrate.

For example, when there are flux residues between the electrode pads, leaks can be caused by the flux residues acting as paths of leakage in a practical environment of use. Let us assume that the substrate is poorly wetted when preliminary soldering is performed between the substrate and bumps on a semiconductor chip to make flip-chip connections and that the solder is pushed out of place during flip-chip connection. Then, bridging can occur between bumps adjacent to each other (see FIG. 14).

JP-A-2006-295114 (Patent Document 1) discloses a semiconductor package having a substrate on which an insulation layer is formed between each pair of electrode pads to insulate the electrode pads from each other. According to Patent Document 1, the substrate is formed as follows. An insulation layer is formed on a support plate, and etching is performed to form recesses on the insulation layer. Thereafter, plating is performed to form metal electrodes in the recesses, and the support plate is removed after forming the metal electrodes to leave an insulation layer between each pair of electrode pads.

SUMMARY OF THE INVENTION

However, according to the substrate manufacturing method disclosed in Patent Document 1, since electrode pads are formed in recesses formed by etching on an insulation layer, a dedicated apparatus is required to manufacture coreless substrates, which results in an increase in the manufacturing cost of the substrates.

Under the circumstance, it is desirable to provide a method of manufacturing a semiconductor package and a method of manufacturing a substrate for the semiconductor package which allow a semiconductor package and a substrate for the package to be manufactured without any increase in the manufacturing cost while suppressing the occurrence of leakage and bridging between electrode pads.

According to an embodiment of the invention, there is provided a method of manufacturing a semiconductor package, including the steps of forming a substrate on which a semiconductor chip is to be mounted and mounting the semiconductor chip on the substrate through connection bumps. The substrate forming step includes a first step of forming a plurality of electrode pads to be bonded to the connection bumps on a part of a support plate, a second step of forming one or more wiring layers on the support plate including the electrode pads with an insulation layer interposed between them, thereby forming the substrate with the electrode pads formed on one side thereof, and a third step of removing the substrate from the support plate. A plurality of first convex portions are formed on the support plate prior to the first step, and the electrode pads are formed on the first convex portions at the first step.

Another embodiment of the invention is directed to the method of manufacturing a semiconductor package according to the embodiment, wherein the first convex portions are formed to have a trapezoidal sectional shape.

Still another embodiment of the invention is directed to the method of manufacturing a semiconductor package according to the embodiment, wherein the first convex portions are formed to have a stepped sectional shape.

Yet another embodiment of the invention is directed to the method of manufacturing a semiconductor package according to any of the foregoing embodiments, wherein the first convex portions are formed to have a diameter greater than the diameter of the electrode pads.

Further another embodiment of the invention is directed to the method of manufacturing a semiconductor package according to any of the foregoing embodiments, wherein a second convex portion is formed between the first convex portions of the support plate.

Still further another embodiment of the invention is directed to the method of manufacturing a semiconductor package according to any of the foregoing embodiments, wherein the first convex portions are formed using etching.

Yet further another embodiment of the invention is directed to the method of manufacturing a semiconductor package according to any of the foregoing embodiments, wherein the first convex portions are formed using a press process.

According to still yet further another embodiment of the invention, there is provided a method of manufacturing a substrate, including a first step of forming a plurality of electrode pads to be bonded to connection bumps on a part of a support plate, a second step of forming one or more wiring layers on the support plate including the electrode pads with an insulation layer interposed between them, thereby forming a substrate having the electrode pads formed on one side thereof, and a third step of removing the substrate from the support plate. A plurality of first convex portions are formed on the support plate prior to the first step, and the electrode pads are formed on the first convex portions at the first step.

DESCRIPTION OF THE PREFERRED EMBODIMENTS

Modes for carrying out the invention (hereinafter referred to as embodiment) will now be described. Explanation will be made in the following order.

1. Configuration of Semiconductor Package
2. Semiconductor Package Manufacturing Method
3. Other Configurations and Manufacturing Methods of the Semiconductor Package

[1. Configuration of Semiconductor Package]

Figure 1:
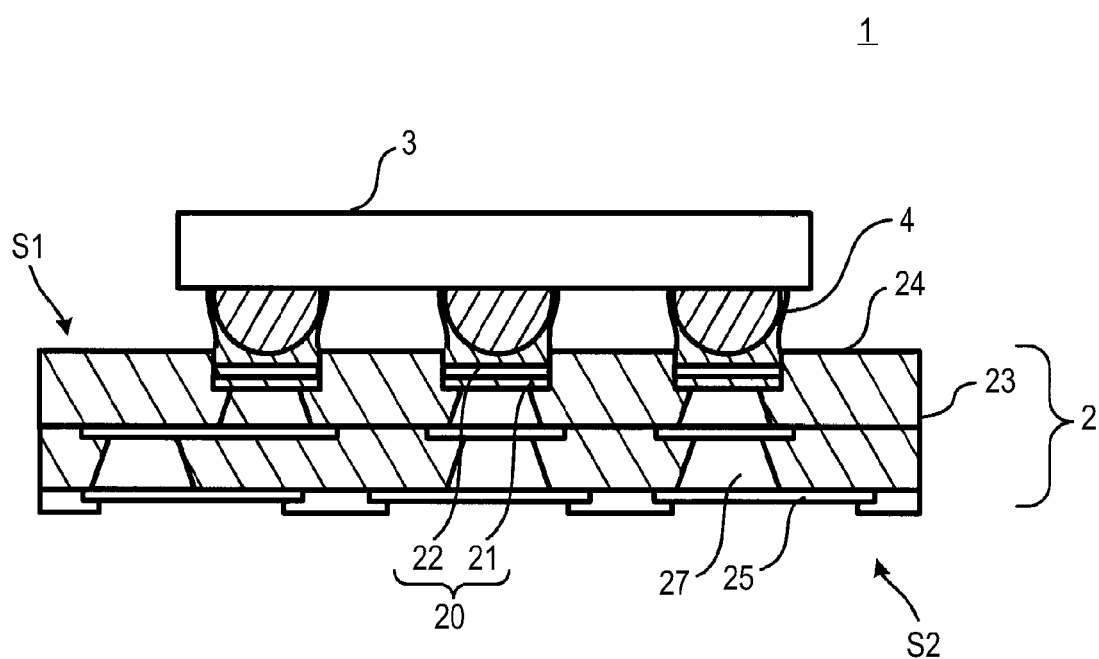
FIG. 1 is an illustration showing a sectional structure of a semiconductor package according to an embodiment of the invention.

A configuration of a semiconductor package according to an embodiment of the invention will now be described in detail with reference to the drawings. FIG. 1 is a sectional view of the semiconductor package according to the embodiment of the invention showing a structure of the same. As shown in FIG. 1, the semiconductor package 1 of the present embodiment includes a semiconductor chip 3 having an integrated circuit formed therein and a substrate 2 on which the semiconductor chip 3 is mounted. Electrode pads 20 are formed on a top surface S1 of the substrate 2, and connection bumps 4 are bonded to the electrode pads 20. Thus, the semiconductor chip 3 is mounted on the top surface S1 of the substrate 2 with the connection bumps 4 interposed.

The substrate 2 is formed as a coreless substrate which has no core layer therein. The substrate 2 has the top surface S1 to which the semiconductor chip 3 is connected and a bottom surface S2 to which a main substrate such as a mother board is connected. A plurality of electrode pads 20 are formed on the top surface S1 of the substrate 2. Raised parts 24 constituting surfaces of an insulation layer 23 are formed between the electrode pads 20. A plurality of external terminals 25 are formed on the bottom surface S2 of the substrate 2, and the surface is covered by a solder resist 26 except the regions of the external terminals 25. The electrode pads 20 and the external terminals 25 are electrically connected through a plurality of wiring layers 27 formed inside the substrate 2.

The electrode pads 20 are electrode terminals for connecting the substrate 2 with the semiconductor chip 3 on the top surface S1 of the substrate 2, and each electrode pad includes an electrode portion 21 and a protective portion 22. An electrode portion 21 functions as an electrode terminal for electrically connecting the substrate 2 and the semiconductor chip 3 on the top surface S1 of the substrate 2, and the terminal is formed from a metal material such as copper (Cu).

A protective portion 22 functions as a protective layer for protecting the surface of the electrode portion 21, and it is formed from a metal material such as gold (Au), palladium (Pd) or nickel (Ni). The protective portion 22 may be a multi-layer structure having layers formed one over another using a plurality of metal materials as mentioned above.

When the substrate 2 and the semiconductor chip 3 are connected, the protective portions 22 serve as mounting surfaces for mounting the connection bumps 4, which may be solder bumps or the like. Therefore, the protective portion 22 is preferably formed from gold (Au) in order to achieve high wettability between the protective portions 22 and the connection bumps 4. When the protective portions 22 are formed as multi-layer structures, the top layers of the portions are preferably formed from gold (Au).

The insulation layers 23 provide insulation between the wiring layers 27 each having a multiplicity of layers. For example, the insulation layers 23 are formed from a resin material. The insulation layers 23 has raised portions 24 formed on the top surface S1 so as to surround each electrode pad 20, and the raised portions 24 also have the function of extending creeping distances between the electrode pads 20. Since the raised portions 24 are formed between the electrode pads 20 as thus described, a raised portion 24 serves as a barrier between connections bumps 4 bonded to each pair of adjoining electrode pads 20. That is, the raised portion 24 intervenes between the connection bumps 4 as a barrier to suppress the occurrence of bridging between the connection bumps 4.

Since the raised portions 24 are formed between the electrode pads 20, when flux is applied to a preliminary solder 41 to improve adhesion between the solder bumps 4 and the preliminary solder 41 for mounting the semiconductor chip 3 on the substrate 2, the raised portions 24 serve as barriers to prevent the flux from leaking from one electrode pad 20 to another adjoining the same. It is therefore possible to prevent leakage paths from being formed by the flux between adjoining electrode pads 20, and the occurrence of leakage attributable to the flux can be prevented between the electrode pads 20.

Since some regions of the top surface S1 of the insulation layer 23 serve as the raised portions 24 as described above, there is no need for forming a solder resist on the top surface S1 of the substrate. It is therefore possible to increase the creeping distances between the electrode pads 20 without forming a solder resist. Since there is no need for using a dedicated apparatus to form a solder resist on both sides of the coreless substrate, the manufacturing cost can be kept low.

As described above, the substrate 2 forming part of the semiconductor package 1 according to the embodiment has the raised portions 24 formed between the electrode pads 20 on the top surface S1 of the substrate 2. Therefore, when the semiconductor chip 3 is mounted on the substrate 2, the raised portions 24 serve as barriers formed between the connection bumps 4 bonded to the respective pairs of adjoining electrode pads 20, whereby the generation of solder bridges between the connection bumps 4 can be prevented. When flux is applied onto a preliminary solder 41 before mounting the semiconductor chip 3 on the substrate 2, the raised portions 24 serve as barriers, which allow the occurrence of leakage between the electrode pads 20 attributable to the flux to be prevented. Further, since the raised portions 24 are formed on the top surface S1 of the substrate, there is no need for forming a solder resist on the top surface S1, which eliminates the need for a dedicated apparatus for manufacturing a coreless substrate and consequently allows the manufacturing cost to be kept low.

[2. Semiconductor Package Manufacturing Method]

A method of manufacturing a semiconductor package 1 will now be described with reference to FIGS. 2A to 4E.

[2.1. Method of Manufacturing Substrate 2]

Figure 2A:
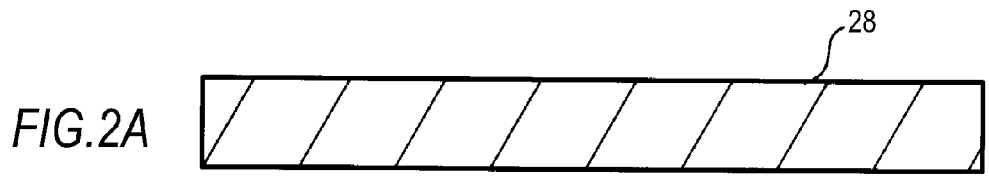
FIGS. 2A to 2E are illustrations showing steps for manufacturing the semiconductor package according to the embodiment of the invention.

First, a method of manufacturing a substrate 2 will be described. As shown in FIG. 2A, a support plate 28 is provided for supporting a substrate 2 which will be fabricated at subsequent steps. For example, the support plate 28 may be formed from a metal material such as copper (Cu). The material of the support plate 28 is not limited to copper (Cu), and metal materials other than copper (Cu) may be used as long as a step of etching the support plate 28 described later adopts etching conditions (e.g., etchant) that the support plate 28 and the protective portions 22 will not be etched away at the same time.

Figure 2B:
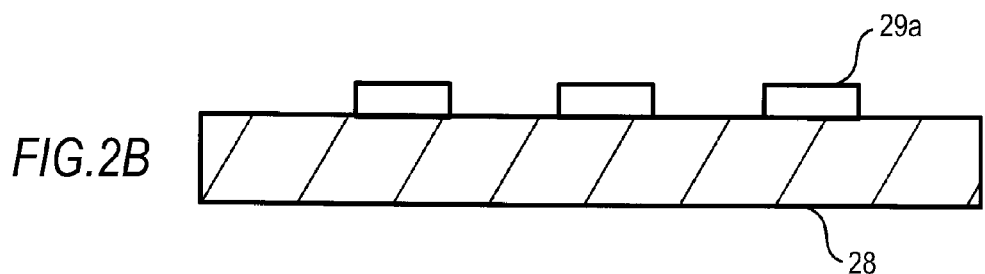

Next, as shown in FIG. 2B, a resist pattern 29a is formed on the support plate 28 using, for example, photolithography. At a subsequent step to be described later, electrode pads 20 will be formed in regions where the resist pattern 29a is formed, and raised portions 24 will be formed in regions other than the regions where the resist pattern 29a is formed. The electrode pads 20 and the raised portions 24 can be accurately patterned by forming the resist pattern 29a using photolithography.

Figure 2C:
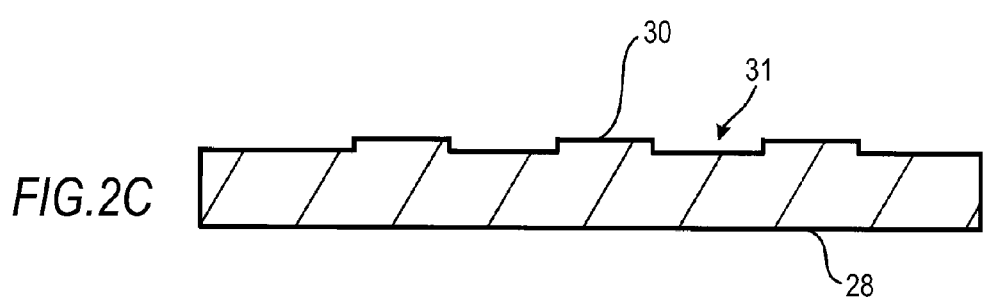

Next, etching is performed to remove parts of the support plate 28 along with the resist pattern 29a as shown in FIG. 2C. As a result, convex portions 30 are formed in the regions where the resist pattern 29a has been formed, and concave portions 31 are formed in the regions other than the regions where the resist pattern 29a has been formed. Since the convex portions 30 and the concave portions 31 are formed on the support plate 28 as thus described, raised portions 24 can be formed on a top surface of an insulation layer 23 at a subsequent step which will be described later. Further, electrode pads 20 can be formed in positions deeper than the positions of the raised portions 24. That is, the electrode pads can be formed inside the insulation layer 23.

Although etching is performed to form the convex portions 30 and the concave portions 31 in the present embodiment, the invention is not limited to such a process. For example, the convex portions 30 and the concave portions 31 may be formed using a molding process employing a press die or a cutting process. When a molding process is performed using a press die, the convex portions 30 and the concave portions 31 can be formed at a time only by processing the die appropriately. As a result, the above-described processes for forming and removing the resist pattern 29a are not required, and improved productivity can therefore be achieved along with a cost reduction. When those portions are formed by cutting the support plate, the above-described processes for forming and removing the resist pattern 29a are not required. Further, since the cutting shape can be easily changed, the convex portions 30 and the concave portions 31 can be formed in arbitrary shapes as occasion demands.

Figure 2D:
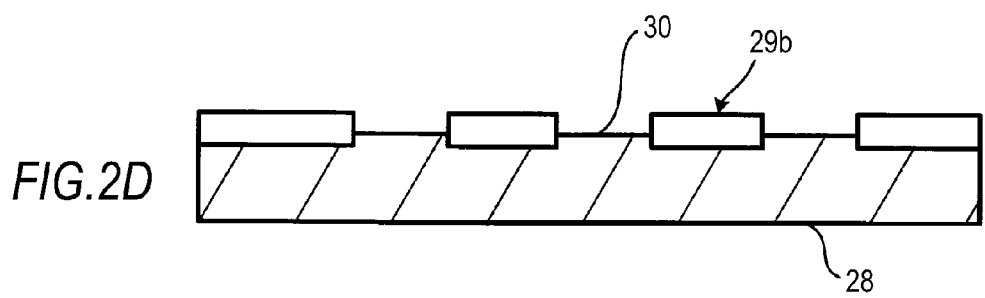
Figure 2E:
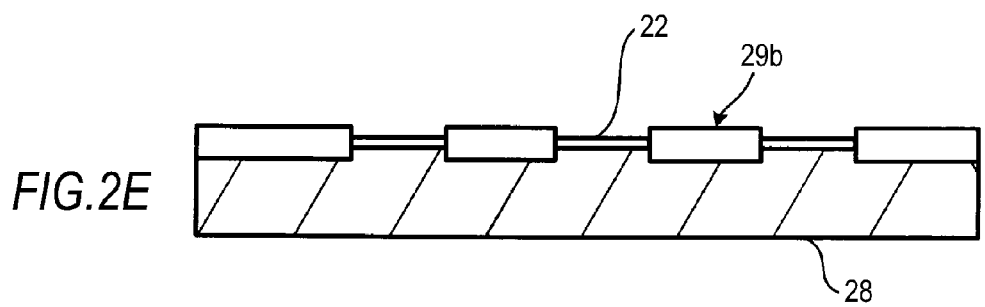

Next, as shown in FIG. 2D, a resist pattern 29b is formed on the concave portions 31 of the support plate 28 using, for example, photolithography. As shown in FIG. 2E, protective portions 22 are thereafter formed on the convex portions 30 of the support plate 28 using, for example, electroplating.

Figure 3A:
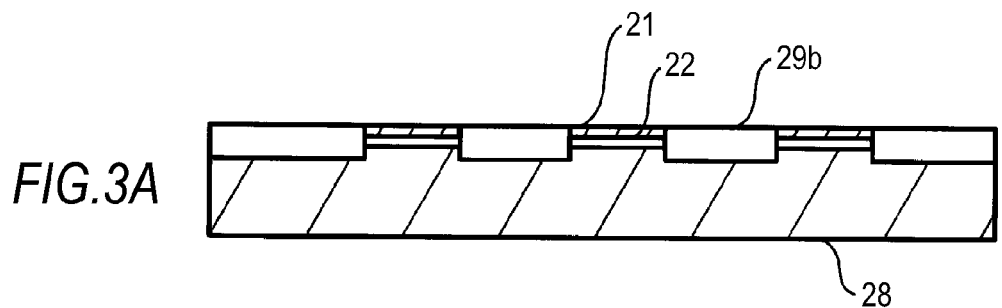
FIGS. 3A to 3E are illustrations showing steps subsequent to those shown in FIGS. 2A to 2E.
Figure 3B:
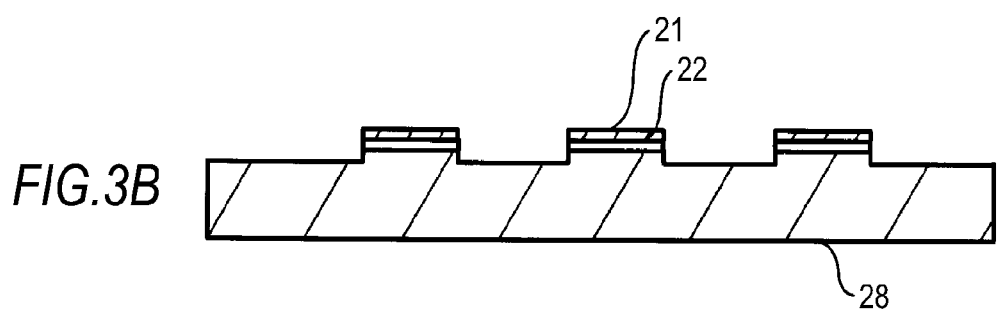

Next, as shown in FIG. 3A, electrode portions 21 are formed on the protective portions 22 using, for example, electroplating. An electrode pad 20 is formed by a protective portion 22 and an electrode portion 21. Since electrode pads 20 are formed on the convex portions 30 of the support plate 28 as thus described. Therefore, the electrode pads 20 can be formed inside an insulation layer 23 or in positions deeper than the positions of the raised portions 24. Next, the resist pattern 29b is removed as shown in FIG. 3B.

Figure 3C:
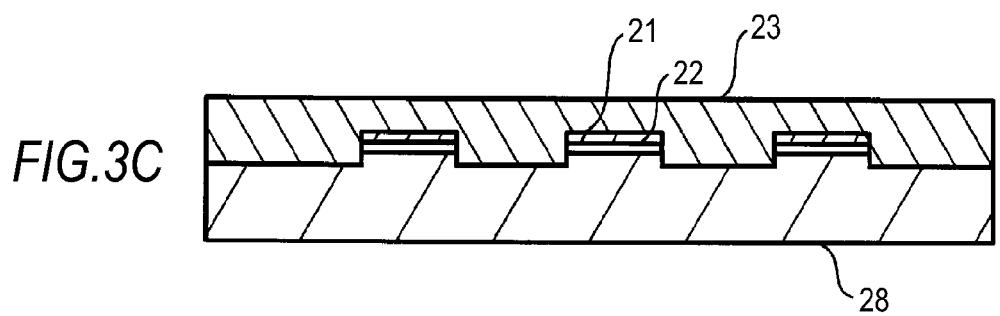

Next, as shown in FIG. 3C, an insulation layer 23, which maybe a resin layer, is formed on the support plate 28 having the electrode pads 20 thereon using, for example, a lamination process. While a lamination process is used to form the insulation layer 23 in the present embodiment, the invention is not limited to such a process, and the insulation layer 23 may alternatively be formed using other methods such as pressing. When the insulation layer 23 is formed using a press, the substrate can be formed using an inexpensive common material suitable for pressing. Further, since pressing allows a plurality of substrates to be fabricated at a time, improved productivity can be achieved along with a cost reduction.

Figure 3D:
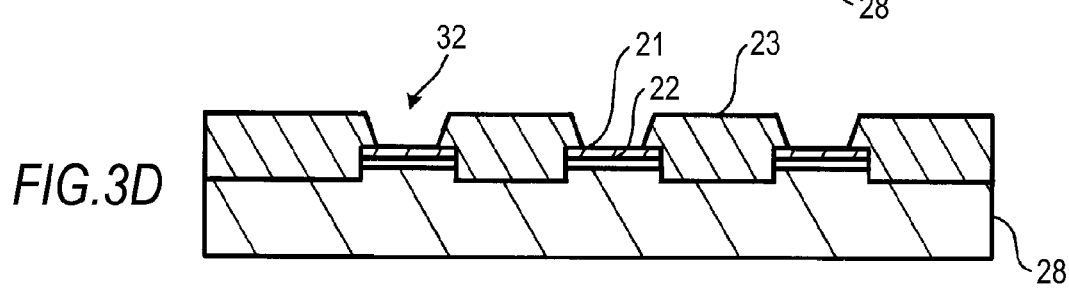

Next, as shown in FIG. 3D, some parts of the insulation layer 23 are removed by performing, for example, etching to form via holes 32. At this time, the via holes 32 are formed in the regions of the insulation layer 23 located above the electrode portions 21. For example, electroplating is performed to form a first wiring layer 27a in each via hole 32 and to form a second wiring layer 27b which extends on a part of the insulation layer 23 and on the first wiring layer 27a, the wiring layers 27a and 27b forming a wiring layer 27.

Figure 3E:
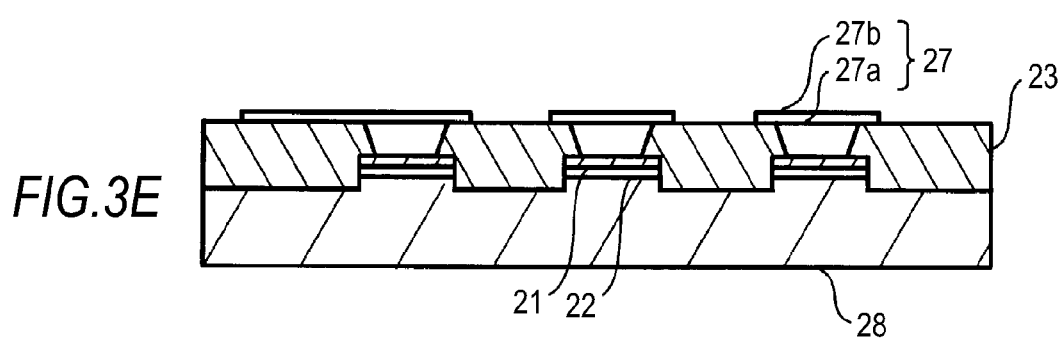
Figure 4A:
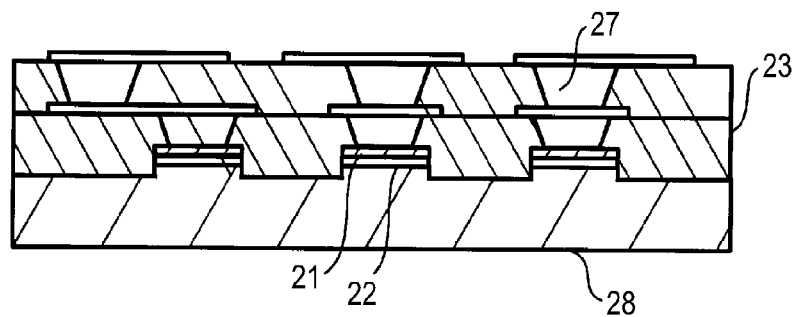
FIGS. 4A to 4E are illustrations showing steps subsequent to those shown in FIGS. 3A to 3E.

In the present embodiment, a multi-layer substrate 2 is provided by stacking two layers each including wiring layers 27. That is, the steps shown in FIGS. 3C, 3D and 3E are performed twice to form a substrate 2 as shown in FIG. 4A. While the wiring layers 27 in the present embodiment are provided in the form of two layers stacked one over another, the invention is not limited to such a configuration. For example, the substrate 2 may have only one layer, and three or more layers each including wiring layers 27 may alternatively be stacked one over another to form a substrate 2.

Figure 4B:
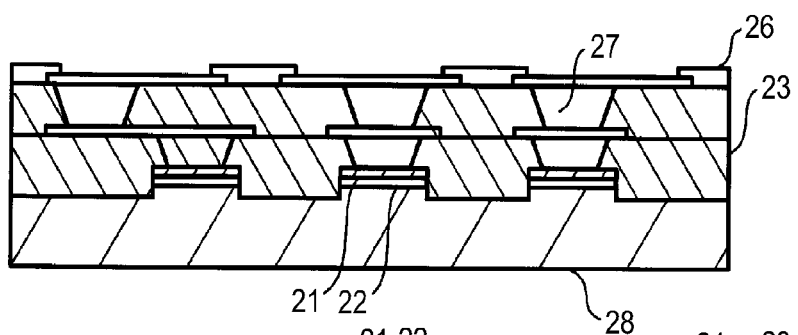

Next, as shown in FIG. 4B, a solder resist 26 is formed on a bottom surface S2 of the substrate 2. At this time, the solder resist 26 is formed between a plurality of the second wiring layers 27b which will serve as external terminals for connecting the semiconductor package 1 to an external substrate such as a motherboard. As a result, the plurality of second wiring layers 27b to serve as external terminals are covered and insulated by the solder resist 26 excluding parts of the layers to function as the external terminals.

Figure 4C:
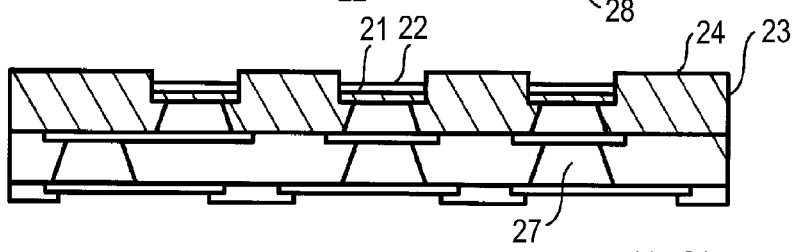

Next, as shown in FIG. 4C, the substrate 2 is turned upside down, and the support plate 28 is thereafter removed from the substrate 2 using, for example, etching. As a result, the protective portions 22 are exposed on the top surface S1 of the substrate 2, and the electrode portions 21 and the protective portions 22 function as electrode terminals when the substrate 2 is electrically connected to a semiconductor chip 3. Each of the combinations of the electrode portions 21 and the protective portions 22 is surrounded by the raised portions 24, and the combinations of the electrode portions 21 and the protective portions 22 are therefore insulated from each other by the raised portions 24.

[2.2 Method of Mounting Semiconductor Chip 3 on Substrate 2]

A method of connecting the substrate 2 to a semiconductor chip 3 will now be described.

Figure 4D:
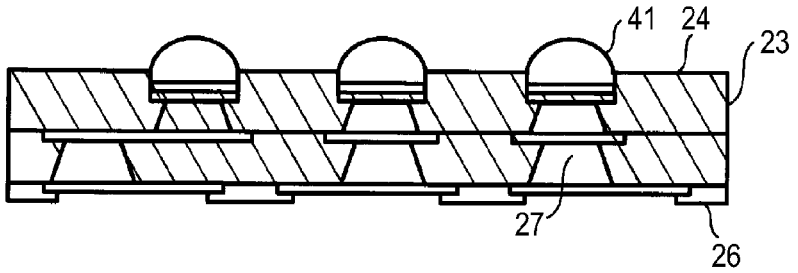

First, as shown in FIG. 4D, a preliminary solder 41 is placed on the protective portions 22. That is, the preliminary solder 41 is placed between the raised portions 24. Referring to the method of placing the preliminary solder 41, although the screen printing method is used in general, other methods such as the solder ball method and the inkjet method may alternatively be used. For example, when the screen printing method is used, the electrode portions 21 are likely to suffer from bridging and resultant variations in the mount of solder during a wet-back process performed after the solder is printed. The problem is more significant, the smaller the pitch of the electrode portions 21 or the greater the amount of solder required for each electrode portion 21. The presence of the raised portions 24 allows the risk of such a problem to be reduced.

For example, let us assume that the solder ball method is used for a coreless substrate structure according to the related art. Then, solder balls placed on the electrode portions 21 to serve as the preliminary solder 41 are held on the electrode portions only by tacking properties of flux applied prior to the solder balls. The presence of the raised portions 24 allows the solder balls to be held by a mechanical effect in addition to the tacking properties (viscosity) of the flux. It is therefore possible to reduce the risk of positional shifts of the solder balls prior to the wet-back process at which the solder balls are heated and melted into a semi-spherical shape.

Figure 4E:
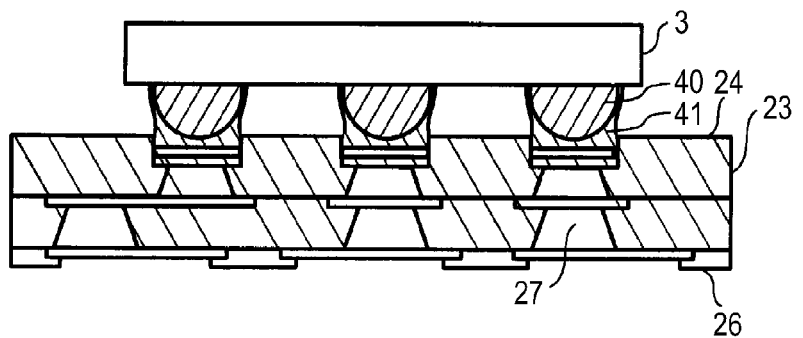

Next, as shown in FIG. 4E, a semiconductor chip 3 is provided, the chip having solder bumps 40 provided on connection terminals thereof. The semiconductor chip 3 having the solder bumps 40 is electrically connected to the substrate 2 having the preliminary solder 41 thereon. Specifically, the solder bumps 40 and the preliminary solder 41 are put in contact with each other to electrically connect the semiconductor chip 3 and the substrate 2. Flux may be applied to either or both of the preliminary solder 41 and the solder bumps 40 in order to achieve high wettability between the solder bumps 40 and the preliminary solder 41. The flux is removed at a subsequent flux cleaning step. If the flux remains as residues after the cleaning, leakage may occur between the electrode portions 21 through the flux residues acting as paths of leakage during a long-term reliability test. According to the method of manufacturing the semiconductor package 1 of the present embodiment, the raised portions 24 are formed between the electrode portions 21, and a long creeping distance can therefore be provided between each pair of adjoining electrode portions 21 to reduce the risk of leakage. Further, when flux is applied to the preliminary solder 41, the presence of the raised portions 24 allows the amount of flux on the preliminary solder 41 to be kept uniform, and high wettability and stable connection can therefore be achieved between the solder bumps 40 and the preliminary solder 41 at a subsequent step of connecting the semiconductor chip 3 to the substrate.

When the solder bumps 40 and the preliminary solder 41 are put in contact with each other, the preliminary solder 41 is heated, and the heated preliminary solder 41 is softened to spread in the direction of the plane of the substrate. As a result, bridging can occur between adjoining solder bumps 40 and between adjoining patterns of the preliminary solder 41. According to the method of manufacturing the semiconductor package 1 of the present embodiment, since the raised portions 24 are formed between the electrode portions 21, even if the preliminary solder 41 is softened to spread in the direction of the plane of the substrate, the movement of the softened preliminary solder 41 is limited by the raised portions 24. It is therefore possible to suppress the occurrence of bridging between the electrode portions 21.

As described above, the method of manufacturing the semiconductor package 1 according to the present embodiment allows the occurrence of leakage and bridging between the electrode portions 21 to be suppressed because the raised portions 24 are formed between the electrode portions 21.

According to the method of manufacturing the semiconductor package 1 of the present embodiment, the raised portions 24 are formed as part of the insulation layer 23, and the raised portions 24 serve as barriers between the electrode portions 21. Thus, barriers can be formed between the electrode portions 21 without using a solder resist. There is no need for putting a large amount of money into facility for forming a solder resist on the coreless substrate having the raised portions 24. It is therefore possible to manufacture the semiconductor package 1 at a low cost and improved productivity.

The invention is not limited to the above-described method of manufacturing the semiconductor package 1 according to the first embodiment, and various modifications may be made to the method. For example, a connection bump 4 is formed by a solder bump 40 and a preliminary solder pattern 41 according to the method of manufacturing the semiconductor package 1 of the embodiment. The invention is not limited to such a process and, for example, a connection bump 4 may alternatively be constituted only by a solder bump 40 without involving a preliminary solder 41. In this case, a structure for bonding the substrate 2 and the semiconductor chip 3 only at the solder bumps 40 without providing the preliminary solder 41 may be employed to mount the semiconductor chip 3 on the substrate 2 with improved accuracy.

According to the method of manufacturing the semiconductor package 1 of the present embodiment, the raised portions 24 are formed on the top surface S1 of the substrate 2. The invention is not limited to such a configuration and, for example, raised portions may alternatively be formed on the surface of the semiconductor chip 3 where the chip is connected to the substrate 2.

[3. Other Configurations and Manufacturing Methods of the Semiconductor Package]

Modifications of the embodiment of the invention will now be described.

[3.1. Modifications 1]

The modifications employ raised portions having a shape different from the shape of the raised portions in the above-described embodiment. Modifications as summarized below will be described in the order listed.

Modification 1-1: Concave portions provided between raised portions are formed to extend a distance greater than the width of electrode portions.

Modification 1-2: Raised portions are formed to have a trapezoidal sectional shape.

Modification 1-3: Raised portions are formed to have a stepped sectional shape, and surfaces of the raised portions put in contact with protective portions 22 are formed to have a diameter greater than the protective portions 22.

Modification 1-4: Raised portions are formed to have a stepped sectional shape, and surfaces of the raised portions put in contact with electrode portions 21 are formed to have a diameter equivalent to the diameter of the electrode portions 21.

[3.1.1. Modification 1-1]

In a semiconductor package 1A according to the present modification, openings 33A formed between raised portions 24A are formed to extend a distance greater than the width of electrode portions 21. When the openings 33A formed between the raised portions 24A formed to extend a distance greater than the width of the electrode portions 21 as thus described, leakage between the electrode portions 21 and bridging between connection bumps 4 can be suppressed as will be apparent from FIGS. 5A to 5E.

Figure 5A:
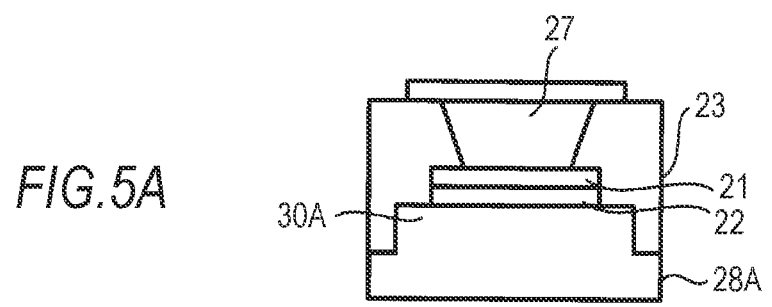
FIGS. 5A to 5E are illustrations showing a sectional structure of a semiconductor package according to a modification of the embodiment of the invention.

A method of manufacturing the semiconductor package 1A of the present modification will now be described with reference to FIGS. 5A to 5E. First, steps similar to those shown in FIGS. 2A to 4B are carried out to form a substrate 2A on a support plate 28A. At this time, convex portions 30A of the support plate 28A are formed with a width greater than the width of electrode portions 21, and protective portions 22 are formed on part of top surfaces of the convex portions 30A of the support plate 28A, as shown in FIG. 5A.

Figure 5B:
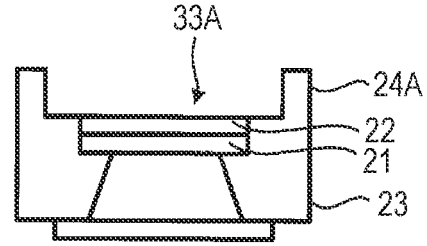
Figure 5C:
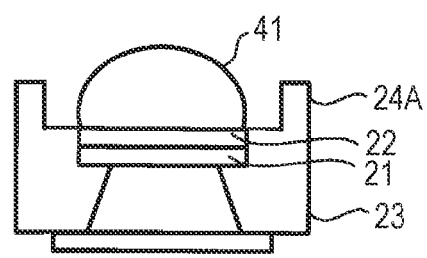

Next, as shown in FIG. 5B, the support plate 28A is removed, for example, by performing etching. Thus, openings 33A are formed to expose part of an insulation layer 23 and protective portions 22. As shown in FIG. 5C, a preliminary solder 41 is thereafter placed on the protective portions 22. At this time, since the openings 33A are formed to have a width greater than the width of the protective portions 22, the preliminary solder 41 can be easily positioned and can therefore be easily placed.

Figure 5D:
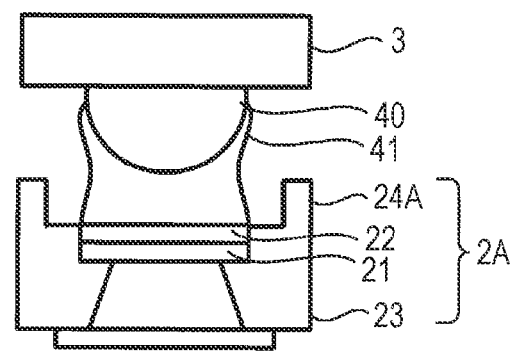

Next, as shown in FIG. 5D, the substrate 2A having the preliminary solder 41 is electrically connected with the semiconductor chip 3 having the solder bumps 40. Specifically, the preliminary solder 41 and the solder bumps 40 are put in contact with each other to electrically connect the substrate 2A and the semiconductor chip 3. At this time, since the openings 33A are formed with a width greater than the width of the protective portions 22, the preliminary solder 41 is prevented from flowing over raised portions 24A to reach the adjacent protective portions 22 even when the preliminary solder 41 is spread in the direction of the plane of the substrate by an excessive force applied to the semiconductor chip 3.

Figure 5E:
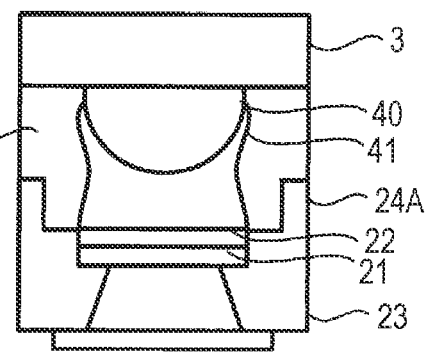

Next, as shown in FIG. 5E, an underfill is inserted between the substrate 2A and the semiconductor chip 3. A semiconductor package 1A according to the present modification is fabricated through the above-described steps.

As described above, in the semiconductor package 1A of the present modification, the openings 33A are formed with a width greater than the width of the protective portions 22. Therefore, the preliminary solder 41 can be easily placed on the protective portions 22 because the preliminary solder 41 can be easily portioned relative to the protective portions 22. When the substrate 2A and the semiconductor chip 3 are electrically connected, the preliminary solder 41 can be prevented from flowing over the raised portions 24A to reach the adjoining protective portions 22 even if the preliminary solder 41 is spread in the direction of the plane of the substrate.

[3.1.2. Modification 1-2]

Figure 6A:
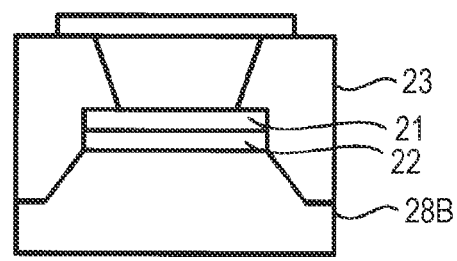
FIGS. 6A to 6E are illustrations showing a sectional structure of a semiconductor package according to another modification of the embodiment of the invention.
Figure 6B:
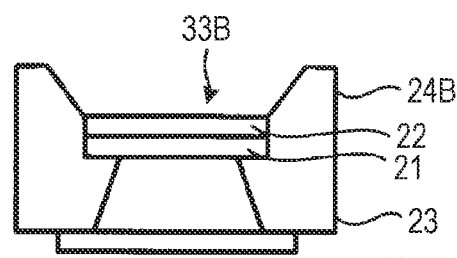
Figure 6C:
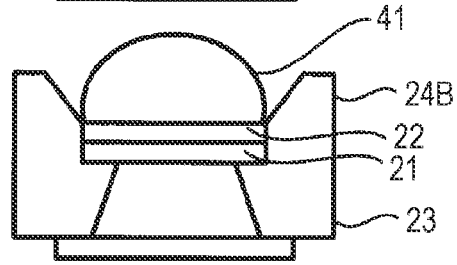
Figure 6D:
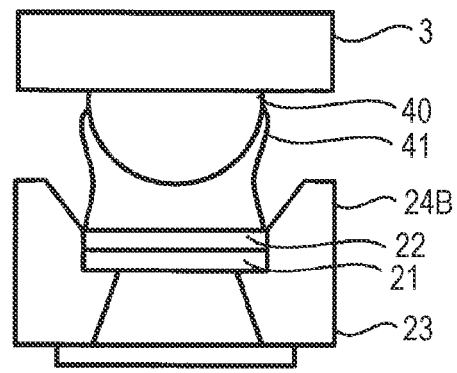

In a semiconductor package 1B according to the present modification, as shown in FIG. 6D, raised portions are formed to have a trapezoidal sectional shape. Since the raised portions are formed to have a trapezoidal sectional shape, flux can be supplied in a stable manner when a preliminary solder 41 is placed on protective portions 22. When a substrate 2B is electrically connected to a semiconductor chip 3, the spread of the preliminary solder 41 in the direction of the plane of the substrate can be controlled by the raised portions.

Next, a method of manufacturing the semiconductor package 1B according to the present modification will be described with reference to FIGS. 6A to 6E. Steps similar to those shown in FIGS. 2A to 4B are carried out to form a substrate 2B on a support plate 28B. At this time, convex portions 30B of the support plate 28B are formed to have a trapezoidal sectional shape, as shown in FIG. 6A.

Next, as shown in FIG. 6B, the support plate 28B is removed, for example, by performing etching. Thus, openings 33B having a trapezoidal sectional shape are formed to expose part of an insulation layer 23 and protective portions 22. The length of the upper side of the openings 33B having a trapezoidal section agrees with the width of the protective portions 22. Each raised portion 24B has an inclined shape formed by a downward slope extending from one edge of the portion toward the bottom of the opening 33B.

Next, as shown in FIG. 6C, a preliminary solder 41 is placed on the protective portions 22. Since the openings 33B are formed to have a trapezoidal sectional shape, when flux is applied after the preliminary solder 41 is placed, the applied flux is supplied to the preliminary solder 41 along the slopes formed to extend from the edges of the raised portions 24B. Thus, the flux is supplied in a stable manner.

Next, as shown in FIG. 6D, the substrate 2B having the preliminary solder 41 and a semiconductor chip 3 having solder bumps 40 are electrically connected. Specifically, the preliminary solder 41 and the solder bumps 40 are put in contact with each other to electrically connect the substrate 2B and the semiconductor chip 3. At this time, since the openings 33B are formed to have a trapezoidal sectional shape, the spread of the preliminary solder 41 in the direction of the plane of the substrate can be controlled.

Figure 6E:
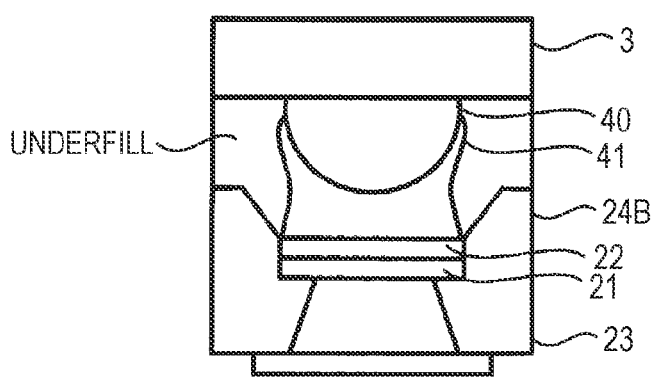

Next, as shown in FIG. 6E, an underfill is inserted between the substrate 2B and the semiconductor chip 3. A semiconductor package 1B according to the present modification is fabricated through the above-described steps.

In the semiconductor package 1B according to the present modification, since the openings 33B are formed to have a trapezoidal sectional shape as described above, flux can be supplied in a stable manner when the preliminary solder 41 is placed on the protective portions 22. When the substrate 2B and the semiconductor chip 3 are electrically connected, the spread of the preliminary solder 41 in the direction of the plane of the substrate can be controlled.

[3.1.3. Modification 1-3]

Figure 7A:
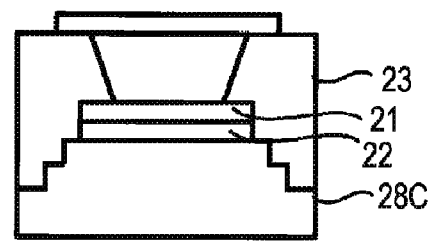
FIGS. 7A to 7E are illustrations showing a sectional structure of a semiconductor package according to still another modification of the embodiment of the invention.
Figure 7B:
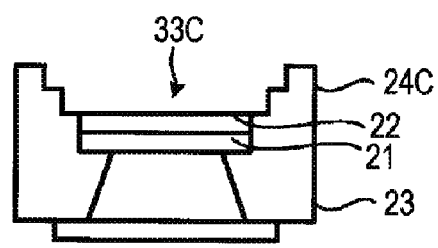
Figure 7C:
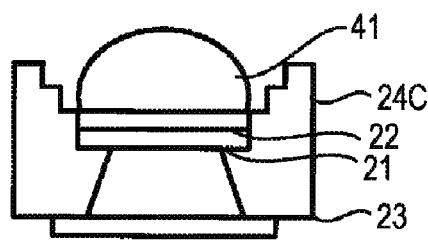
Figure 7D:
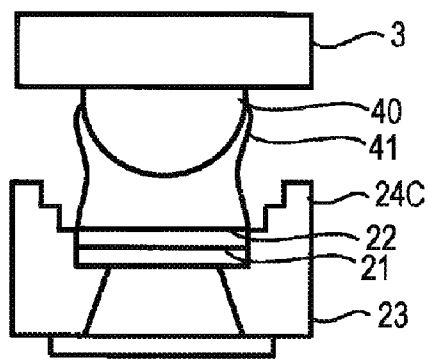

In a semiconductor package 1C according to the present modification, raised portions 24C protrude in a stepped shape as shown in FIG. 7D. Thus, the diameter of surfaces of the raised portions put in contact with protective portions 22 is made greater than the size of the protective portions 22. Since the raised portions 24C protrude in a stepped shape, flux applied for connecting a semiconductor chip 3 to the substrate 2C can be supplied in a stable manner. Further, since the configuration allows longer creeping distances to be provided between the protective portions 22, the occurrence of leakage can be more effectively suppressed between the protective portions 22. The configuration also allows the adhesion of an underfill inserted between the substrate 2C and the semiconductor chip 3 to be kept at a satisfactory level.

A method of manufacturing the semiconductor package 1C according to the present modification will now be described with reference to FIGS. 7A to 7E. Steps similar to those shown in FIGS. 2A to 4B are carried out to form a substrate 2C on a support plate 28C. At this time, convex portions 30C of the support plate 28C are formed in a stepped shape as shown in FIG. 7A.

Next, as shown in FIG. 7B, the support plate 28C is removed, for example, by performing etching. Thus, openings 33C having a stepped shape are formed to expose part of an insulation layer 23 and protective portions 22. The length of the upper sides of the openings 33C having a stepped shape agrees with the width of the protective portions 22.

Next, as shown in FIG. 7C, a preliminary solder 41 is placed on the protective portions 22. At this time, since the openings 33C are formed in a stepped shape, flux can be supplied in a stable manner when the flux is applied after the preliminary solder 41 is placed.

Next, as shown in FIG. 7D, the substrate 2C having the preliminary solder 41 is electrically connected to a semiconductor chip 3 having solder bumps 40. Specifically, the preliminary solder 41 and the solder bumps 40 are put in contact with each other to electrically connect the substrate 2C and the semiconductor chip 3. At this time, since the openings 33C are formed in a stepped shape, longer creeping distances can be provided between the protective portions 22, and the occurrence of leakage can therefore be more effectively suppressed between the protective portions 22.

Figure 7E:
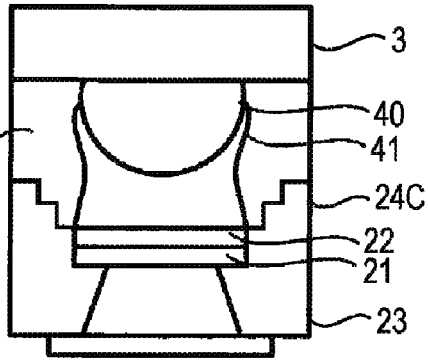

Next, as shown in FIG. 7E, an underfill is inserted between the substrate 2C and the semiconductor chip 3. Since the openings 33C are formed in a stepped shape, the adhesion of the underfill inserted between the substrate 2C and the semiconductor chip 3 can be kept at a satisfactory level. A semiconductor package 1C according to the present modification is fabricated through the above-described steps.

As described above, in the semiconductor package 1C of the present modification, since the openings 33C are formed in a stepped shape, flux can be supplied in a stable manner when the preliminary solder 41 is placed on the protective portions 22. The occurrence of leakage between the protective portions 22 can be more effectively suppressed when the substrate 2C and the semiconductor chip 3 are electrically connected. Further, the underfill can be inserted between the substrate 2C and the semiconductor chip 3 with satisfactory adhesion to them.

[3.1.4. Modification 1-4]

Figure 8A:
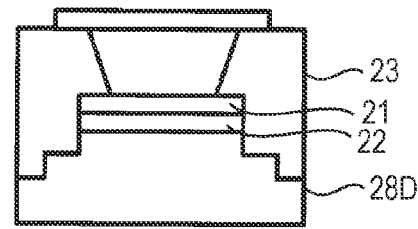
FIGS. 8A to 8E are illustrations showing a sectional structure of a semiconductor package according to still another modification of the embodiment of the invention.
Figure 8B:
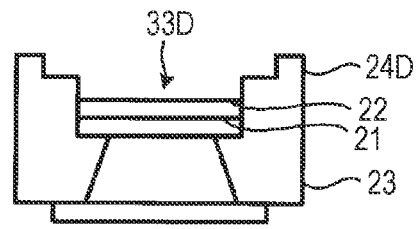
Figure 8C:
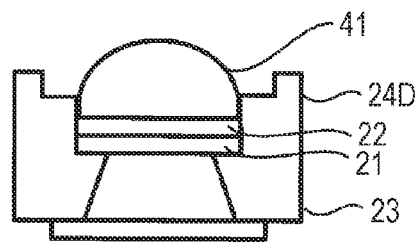
Figure 8D:
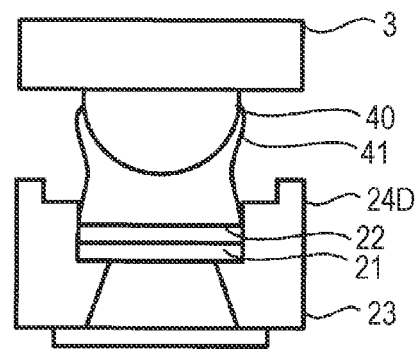

In a semiconductor package 1D according to the present modification, as shown in FIG. 8D, raised portions 24D protrude in a stepped shape, and the diameter of surfaces of the raised portions in contact with electrode portions 21 is equivalent to that of the electrode portions 21. Thus, flux can be supplied in a stable manner when the preliminary solder 41 is placed on the protective portions 22. When the substrate 2D is connected to a semiconductor chip 3, longer creeping distances can be provided between the electrode portions 21, which allows the occurrence of leakage between the electrode portions 21 to be suppressed. Further, when an underfill is inserted between the substrate 2D and the semiconductor chip 3, the adhesion of the underfill can be kept at a satisfactory level.

A method of manufacturing the semiconductor package 1D according to the present modification will now be described with reference to FIGS. 8A to 8E. Steps similar to those shown in FIGS. 2A to 4B are carried out to form a substrate 2D on a support plate 28D. At this time, convex portions 30D of the support plate 28D are formed in a stepped shape as shown in FIG. 8A. A top part of each convex portion 30D is formed in the same width as an electrode portion 21.

Next, as shown in FIG. 8B, the support plate 28D is removed, for example, by performing etching. Thus, openings 33D having a stepped shape are formed to expose part of an insulation layer 23 and protective portions 22. A bottom part of each opening 33D has the same width as a protective portion 22.

Next, as shown in FIG. 8C, a preliminary solder 41 is placed on the protective portions 22. Since the openings 33D are formed in a stepped shape, when flux is applied after the preliminary solder 41 is placed, the applied flux can be supplied in a stable manner.

Next, as shown in FIG. 8D, the substrate 2D having the preliminary solder 41 and a semiconductor chip 3 having solder bumps 40 are electrically connected. Specifically, the preliminary solder 41 and the solder bumps 40 are put in contact with each other to electrically connect the substrate 2D and the semiconductor chip 3. At this time, since the openings 33D are formed in a stepped shape, long creeping distances can be provided between the protective portions 22, which allows the occurrence of leakage between the protective portions 22 to be suppressed more effectively.

Figure 8E:
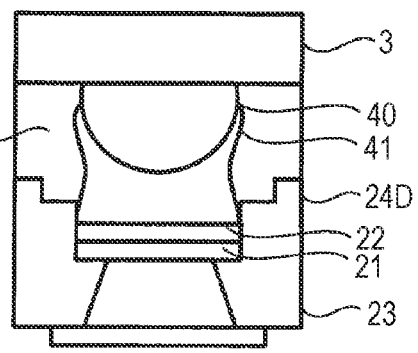

Next, as shown in FIG. 8E, an underfill is inserted between the substrate 2D and the semiconductor chip 3. At this time, since the openings 33D are formed in a stepped shape, the adhesion of the underfill inserted between the substrate 2D and the semiconductor chip 3 can be kept at a satisfactory level. A semiconductor package 1D according to the present modification is fabricated through the above-described steps.

As described above, in the semiconductor package 1D according to the present modification, since the openings 33D are formed in a stepped shape, flux can be supplied in a stable manner when the preliminary solder 41 is placed on the protective portions 22. When the substrate 2D and the semiconductor chip 3 are electrically connected, the occurrence of leakage between the protective portions 22 can be more effectively suppressed. The adhesion of the underfill inserted between the substrate 2D and the semiconductor chip 3 can be kept at a satisfactory level.

[3.2. Modifications 2]

The modifications employ raised portions formed with a concave part to maintain sufficient creeping distances between electrode portions. Modifications as summarized below will be described in the order listed.

Modification 2-1: Raised portions are formed with a concave part having a square sectional shape.

Modification 2-2: Raised portions are formed with a concave part having a trapezoidal sectional shape.

Modification 2-3: Raised portions are formed with a concave part having a stepped sectional shape.

[3.2.1. Modification 2-1]

Figure 9A:
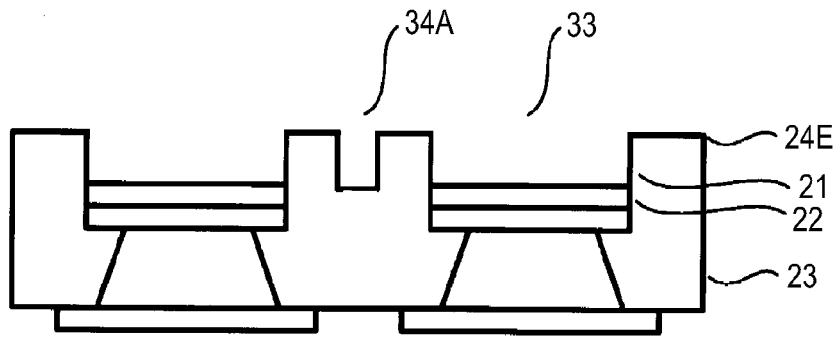
FIGS. 9A and 9B are illustrations showing a sectional structure of a semiconductor package according to still another modification of the embodiment of the invention.

As shown in FIG. 9A, a semiconductor package according to the present modification includes a substrate 2E having raised portions 24E formed with a concave part 34A having a square sectional shape. Satisfactory creeping distances can be provided between electrode portions of the substrate 2E because the substrate includes the raised portions 24E formed with a concave part 34A having a square sectional shape.

It is therefore possible to suppress the occurrence of leakage and bridging between electrode portions 21. For example, when there are flux residues between openings 33 adjacent to each other, the flux residues are accumulated in a concave part 34A formed between the openings 33 adjacent to each other. Thus, the formation of a path of leakage attributable to flux residues can be prevented between the openings 33 adjacent to each other. It is therefore possible to prevent the occurrence of leakage and bridging between adjoining electrode portions 21 associated with the openings.

Figure 9B:
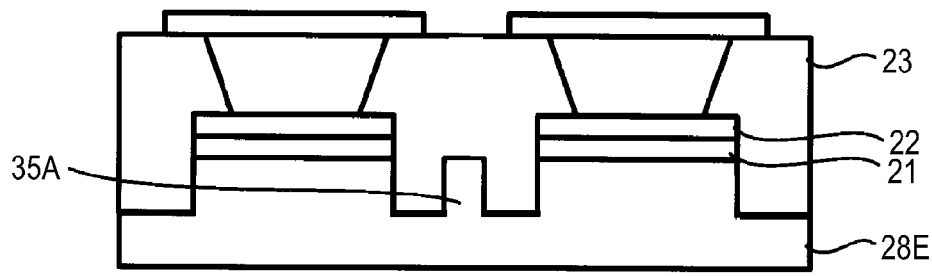

The substrate 2E having the above-described configuration is manufactured through manufacturing steps similar to those described above and shown in FIGS. 2A to 4D. In order to form the concave parts 34A which are features characteristic of the present modification, a support plate 28E as shown in FIG. 9B is used. The support plate 28E is formed with convex portions 30 and second convex portions 35A. The openings 33 and the concave parts 34A of the substrate 2E can be formed using the convex portions 30 and the second convex portions 35A.

[3.2.2. Modification 2-2]

Figure 10A:
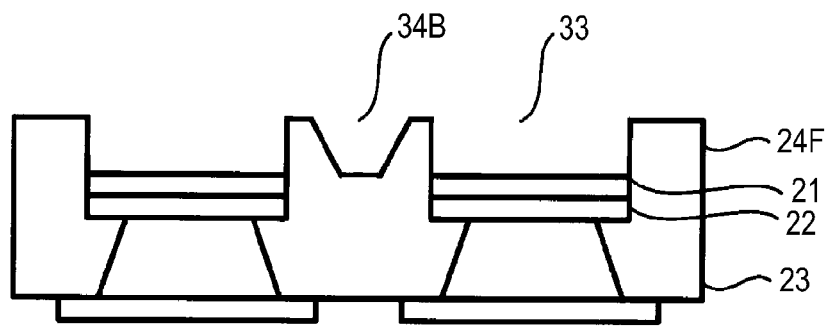
FIGS. 10A and 10B are illustrations showing a sectional structure of a semiconductor package according to still another modification of the embodiment of the invention.

As shown in FIG. 10A, a semiconductor package according to the present modification includes a substrate 2F having raised portions 24F formed with a concave part 34B having a trapezoidal sectional shape. Just as in the above-described substrate 2E, satisfactory creeping distances can be provided between electrode portions 21 of the substrate 2F because the substrate includes the raised portions 24F formed with a concave part 34B having a trapezoidal sectional shape.

It is therefore possible to suppress the occurrence of leakage and bridging between electrode portions 21. When there are flux residues between openings 33 adjacent to each other, the flux residues are accumulated in a concave part 34B formed between the openings 33 adjacent to each other in the same way as done by the above-described concave part 34A. Thus, the formation of a path of leakage attributable to flux residues can be prevented between the openings 33 adjacent to each other. It is therefore possible to prevent the occurrence of leakage and bridging between adjoining electrode portions 21 associated with the openings.

Figure 10B:
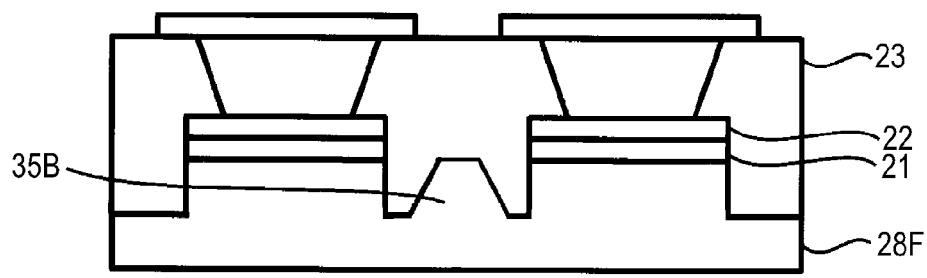

The substrate 2F having the above-described configuration is manufactured through manufacturing steps similar to those described above and shown in FIGS. 2A to 4D. In order to form the concave parts 34B which are features characteristic of the present modification, a support plate 28F as shown in FIG. 10B is used. The support plate 28F is formed with convex portions 30 and second convex portions 35B. The openings 33 and the concave parts 34B of the substrate 2F can be formed using the convex portions 30 and the second convex portions 35B.

[3.2.3. Modification 2-3]

As shown in FIG. 1A, a semiconductor package according to the present modification includes a substrate 2G having raised portions 24G formed with a concave part 34C having a stepped sectional shape. Just as in the above-described substrates 2E and 2F, satisfactory creeping distances can be provided between electrode portions 21 of the substrate 2G because the substrate includes the raised portions 24G formed with a concave part 34C having a stepped sectional shape.

It is therefore possible to suppress the occurrence of leakage and bridging between electrode portions 21. When there are flux residues between openings 33 adjacent to each other, the flux residues are accumulated in a concave part 34C formed between the openings 33 adjacent to each other in the same way as done by the above-described concave parts 34A and 34B. Thus, the formation of a path of leakage attributable to flux residues can be prevented between the openings 33 adjacent to each other. It is therefore possible to prevent the occurrence of leakage and bridging between adjoining electrode portions 21 associated with the openings.

Figure 11A:
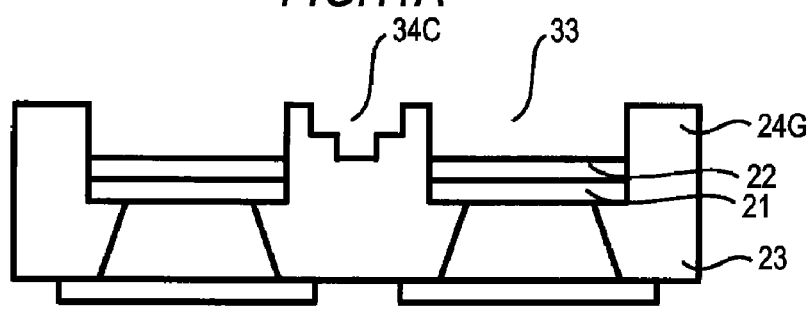
FIGS. 11A and 11B are illustrations showing a sectional structure of a semiconductor package according to still another modification of the embodiment of the invention.
Figure 11B:
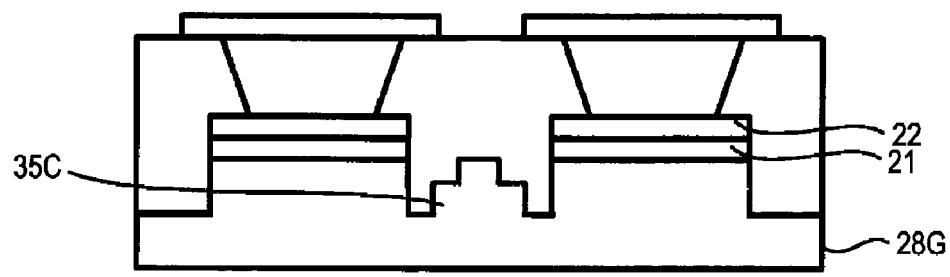

The substrate 2G having the above-described configuration is manufactured through manufacturing steps similar to those described above and shown in FIGS. 2A to 4D. In order to form the concave parts 34C which are features characteristic of the present modification, a support plate 28G as shown in FIG. 11B is used. The support plate 28G is formed with convex portions 30 and second convex portions 35C. The openings 33 and the concave parts 34C of the substrate 2G can be formed using the convex portions 30 and the second convex portions 35C.

Figure 12A:
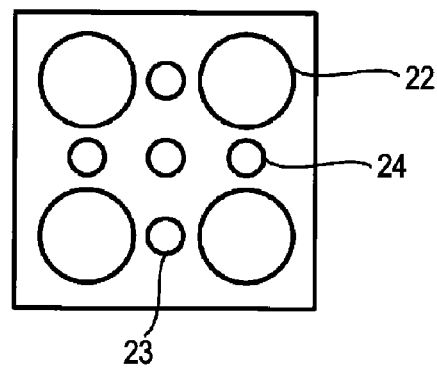
FIGS. 12A and 12B are illustrations showing sectional structures of semiconductor packages according to other modifications of the embodiment of the invention.
Figure 12B:
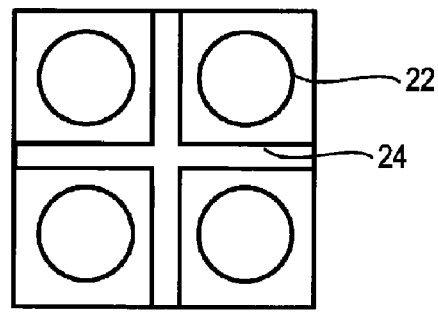
Figure 13:
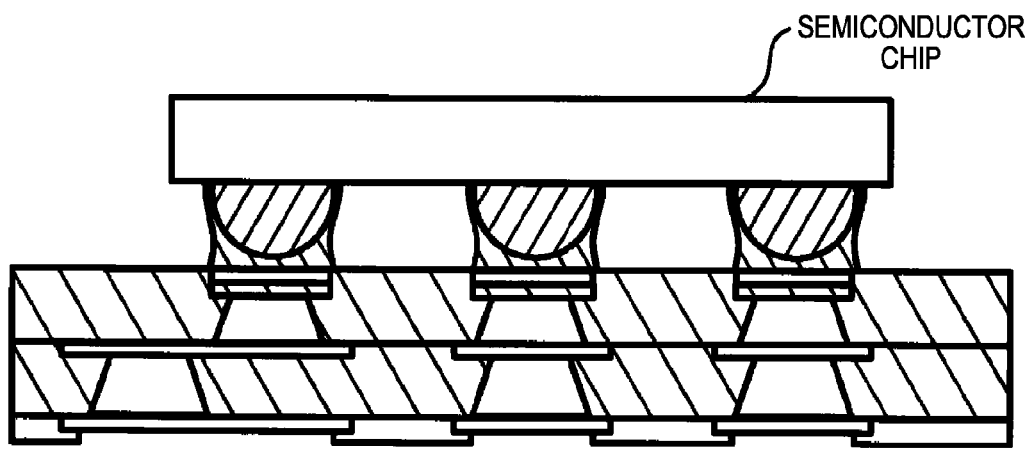
FIG. 13 is an illustration showing a sectional structure of a semiconductor package according to the related art.
Figure 14:
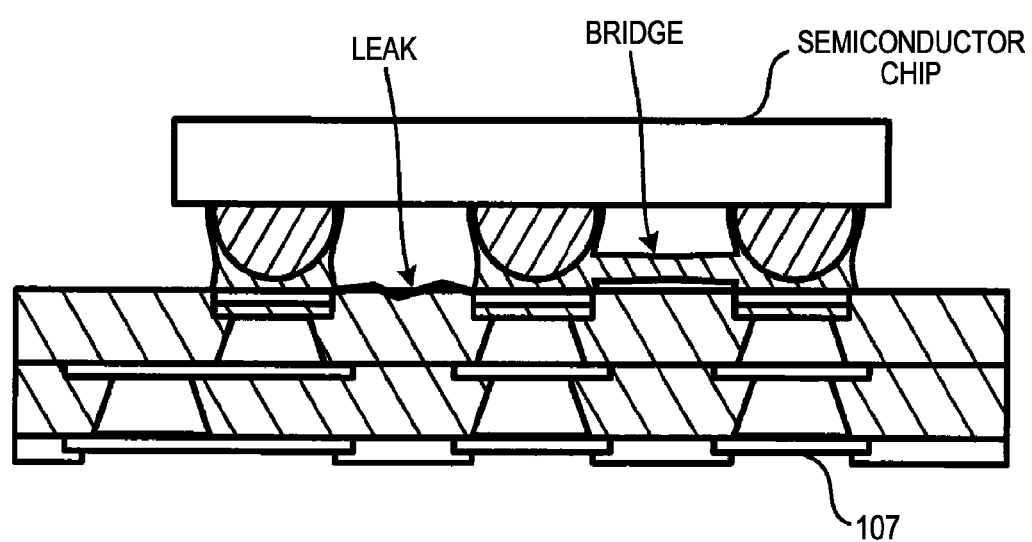
FIG. 14 is an illustration showing problems in the semiconductor package according to the related art.

An embodiment of the invention and several modifications of the embodiment have been described above. The invention is not limited to the above-described embodiments and may be modified in various ways. For example, as shown in FIG. 12A, concave portions between raised portions may be formed by disposing a plurality of discrete raised portions between electrode portions 21. Alternatively, a groove-like concave portion may be formed between raised portions as shown in FIG. 12B. Still alternatively, discrete concave portions may be disposed between raised portions in a part of a substrate while forming a groove-like concave portion in another part of the substrate, as shown in FIG. 12B.

The present application contains subject matter related to that disclosed in Japanese Priority Patent Application JP 2009-145229 filed in the Japan Patent Office on Jun. 18, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor package, comprising the steps of:
    forming a substrate on which a semiconductor chip is to be mounted; and
    mounting the semiconductor chip on the substrate through connection bumps,
    the substrate forming step including
    a first step of forming a plurality of electrode pads to be bonded to the connection bumps on a part of a support plate,
    a second step of forming one or more wiring layers on the support plate including the electrode pads with an insulation layer interposed between them, thereby forming a substrate having the electrode pads formed thereon on one side thereof, and
    a third step of removing the substrate from the support plate, wherein
    a plurality of first convex portions are formed on the support plate prior to the first step, and the electrode pads are formed on the first convex portions at the first step.

2. A method of manufacturing a semiconductor package according to claim 1, wherein the first convex portions are formed to have a trapezoidal sectional shape.

3. A method of manufacturing a semiconductor package according to claim 1, wherein the first convex portions are formed to have a stepped sectional shape.

4. A method of manufacturing a semiconductor package according to any of claims 1 to 3, wherein the first convex portions are formed to have a diameter greater than the diameter of the electrode pads.

5. A method of manufacturing a semiconductor package according to any of claims 1 to 3, wherein a second convex portion is formed between the first convex portions of the support plate.

6. A method of manufacturing a semiconductor package according to any of claims 1 to 3, wherein the first convex portions are formed using etching.

7. A method of manufacturing a semiconductor package according to any of claims 1 to 3, wherein the first convex portions are formed using a press process.

8. A method of manufacturing a substrate, comprising:
    a first step of forming a plurality of electrode pads to be bonded to connection bumps on a part of a support plate;
    a second step of forming one or more wiring layers on the support plate including the electrode pads with an insulation layer interposed between them, thereby forming a substrate having the electrode pads formed on one side thereof; and
    a third step of removing the substrate from the support plate, wherein
    a plurality of first convex portions are formed on the support plate prior to the first step, and the electrode pads are formed on the first convex portions at the first step.

* * * * *